United States Patent [19]

Kot

[11] Patent Number: 6,134,569

[45] Date of Patent: Oct. 17, 2000

[54] POLYPHASE INTERPOLATOR/DECIMATOR USING CONTINUOUS-VALUED, DISCRETE-TIME SIGNAL PROCESSING

[75] Inventor: Alan D. Kot, Vancouver, Wash.

[73] Assignee: Sharp Laboratories of America, Inc., Camas, Wash.

[21] Appl. No.: 08/789,952

[22] Filed: Jan. 30, 1997

[51] Int. Cl.[7] .............................. G06J 1/00; G06G 7/22; G06F 17/17; G06F 17/10

[52] U.S. Cl. .......................... 708/3; 708/313; 708/316; 708/819

[58] Field of Search .................................. 364/602, 825, 364/724.1, 724.16, 724.13; 708/3, 819, 313, 319, 316

[56] References Cited

U.S. PATENT DOCUMENTS

| | | |
|---|---|---|
| 4,020,332 | 4/1977 | Crochiere et al. . |
| 4,612,625 | 9/1986 | Bertrand . |
| 4,646,133 | 2/1987 | Blanchard et al. . |
| 4,725,972 | 2/1988 | Göckler . |
| 4,775,851 | 10/1988 | Borth . |
| 4,782,324 | 11/1988 | Underwood . |
| 4,817,025 | 3/1989 | Asai et al. ........................ 364/724.16 |
| 4,972,357 | 11/1990 | Morel . |
| 4,999,798 | 3/1991 | McCaslin et al. . |
| 5,018,090 | 5/1991 | Shiratsuchi . |
| 5,255,215 | 10/1993 | Sakata et al. . |
| 5,262,970 | 11/1993 | Sevenhans et al. . |
| 5,289,392 | 2/1994 | Yamamoto . |
| 5,319,317 | 6/1994 | Shou et al. . |
| 5,331,323 | 7/1994 | Yamamoto . |
| 5,343,419 | 8/1994 | Shu et al. . |
| 5,361,219 | 11/1994 | Shou et al. . |
| 5,381,352 | 1/1995 | Shou et al. . |
| 5,381,375 | 1/1995 | Shou et al. . |
| 5,388,063 | 2/1995 | Takatori et al. . |
| 5,394,107 | 2/1995 | Shou et al. . |
| 5,396,442 | 3/1995 | Shou et al. . |
| 5,396,446 | 3/1995 | Shou et al. . |
| 5,400,368 | 3/1995 | Cheng et al. . |
| 5,406,131 | 4/1995 | Shou et al. . |
| 5,408,142 | 4/1995 | Takatori et al. . |
| 5,408,422 | 4/1995 | Takatori et al. . |

(List continued on next page.)

OTHER PUBLICATIONS

Crochiere et al., "Multirate Digital Signal Processing," Prentice–Hall, Inc., © 1983.

*Primary Examiner*—Tan V. Mai
*Attorney, Agent, or Firm*—David C. Ripma; Matthew D. Rabdau; Scott C. Krieger

[57] ABSTRACT

A signal processor which can be configured to perform interpolation or decimation of an analog input signal, using a combination of continuous-valued discrete-time sampling together with digital filter coefficients. In its preferred embodiment, the signal processor includes a signal sampling circuit configured to produce a continuous-valued discrete-time sequence of the most recent N input samples, with the sequence being stored in a circular buffer arrangement of sample-and-hold circuits. Further, in its preferred embodiment, the signal processor includes a filter coefficient shift-register that stores digital filter coefficients, with the shift register contents being cyclically shifted to maintain the correct time correspondence with the input samples held in the circular buffer of input samples. Further, in its preferred embodiment, connections from the digital filter coefficient shift-register are made to a set of analog-digital multipliers such that polyphase filter coefficients can be extracted from the shift register. The analog-digital multipliers can be of a type that operate as digitally programmable amplifiers, or equivalently, that operate as multiplying digital-to-analog converters. For implementing interpolation by a factor of L (or decimation by a factor of M) the output rate is L times (or 1/M times) the input rate sample, there are L (or M) polyphase filters, the number of polyphase filter outputs that are summed is set to one (or M), and the number of multipliers is equal to N (or N/M). As well, for decimation, an input-phase-selection circuit is employed to provide M polyphase subsequences from the circular buffer of input samples.

21 Claims, 2 Drawing Sheets

U.S. PATENT DOCUMENTS

| | | |
|---|---|---|
| 5,416,370 | 5/1995 | Takatori et al. . |
| 5,416,439 | 5/1995 | Shou et al. . |
| 5,420,807 | 5/1995 | Shou et al. . |
| 5,420,850 | 5/1995 | Umeda et al. . |
| 5,424,965 | 6/1995 | Shou et al. . |
| 5,424,973 | 6/1995 | Shou et al. . |
| 5,452,336 | 9/1995 | Shou et al. . |
| 5,453,711 | 9/1995 | Yamamoto . |
| 5,455,581 | 10/1995 | Shou et al. . |
| 5,457,417 | 10/1995 | Shou et al. . |
| 5,465,064 | 11/1995 | Shou et al. . |
| 5,469,102 | 11/1995 | Shou et al. . |
| 5,483,288 | 1/1996 | Hong . |
| 5,519,732 | 5/1996 | Chester . |
| 5,528,527 | 6/1996 | Iwata et al. ............... 364/724.1 |
| 5,563,819 | 10/1996 | Nelson . |
| 5,706,220 | 1/1998 | Vafai et al. ............... 364/724.13 |

POLYPHASE INTERPOLATOR/DECIMATOR USING CONTINUOUS-VALUED, DISCRETE-TIME SIGNAL PROCESSING

FIELD OF THE INVENTION

This invention relates generally to signal processing of analog signals, and more particularly, to polyphase interpolation and decimation of continuous-valued, discrete-time signals.

BACKGROUND OF THE INVENTION

It is sometimes desirable to perform signal processing using continuous-valued discrete-time samples of an input signal. This may be advantageous in some applications where high operating speed is important, and where the repeatability offered by digital signal processing is not required. In such an application it may be possible to perform the processing with less complex hardware and power consumption than a digital implementation would require.

One type of signal processing which is frequently necessary with discrete-time signals is sampling rate conversion. For example, sampling rate conversion can be used to interface to a communications system or a data storage system that uses a different sampling rate. Sampling rate conversion also can be used when partitioning a signal into sub-bands for sub-band processing.

The principal techniques to accomplish sampling rate conversion are referred to as interpolation and decimation. In interpolation, a discrete-time signal is up-sampled and lowpass filtered to generate a higher sample rate signal. In decimation, a discrete-time signal is lowpass filtered and down-sampled to generate a lower sample rate signal. One example circuit for carrying out interpolation and decimation with digital signals is described in U.S. Pat. No. 4,020,332, which is incorporated herein by reference. A more recent and complete treatment of the subject is found in "Multirate Digital Signal Processing by Crochiere and Rabiner", Prentice-Hall, copyright 1983, which is also incorporated herein by reference.

One example of a technique for processing continuous-valued discrete-time samples of an input signal is shown in U.S. Pat. No. 5,396,446, which is incorporated herein by reference. That patent discloses a circuit which filters an analog input signal with digital filter coefficients. The filter circuit includes a bank of N sample-and-hold devices which are activated cyclically to sample and store an analog input signal at N most recent sample times. The cyclic activation of the sample-and-hold devices (in a manner essentially equivalent to a circular-buffer) avoids the use of an analog shift-register, and so avoids the accumulation of errors associated with transferring continuous-valued samples from one sample-and-hold device to another. The digital filter coefficients are stored in a filter-coefficient shift-register, where each cell of the shift-register holds a digital value representing a filter coefficient. The shift-register contents are cycled at the input sample rate in order to maintain the correct correspondence of the N filter coefficients with the circularly buffered input samples. A multiplication circuit that employs N multipliers, each capable of multiplying a continuous-valued input sample by a digital value, connects the filter-coefficient shift-register and the sample-and-hold devices. The N multiplier outputs are summed to generate a filtered continuous-valued discrete-time signal. The input and output sample rates of the device are the same. U.S. Pat. No. 5,563,819 to Nelson discloses another similar system for processing continuous-valued discrete-time samples of an input signal.

Due to the need sometimes to change the sample rate, and because it sometimes is desirable to carry out the processing using continuous-valued discrete-time samples, it is an object of the present invention to provide a signal processor which can perform sampling rate conversion of continuous-valued discrete-time samples. More particularly, it would be desirable to provide an signal processor with the basic function of interpolation and decimation of such samples. It is also an object of the present invention to provide a interpolator/decimator configuration which is relatively simple to implement. Another object of the invention is to provide an interpolator/decimator which does not introduce significant artifacts into the signal.

SUMMARY OF THE INVENTION

The present invention is a signal processor which can be configured to perform interpolation or decimation of an analog input signal, using a combination of continuous-valued discrete-time sampling together with digital filter coefficients. In its preferred embodiment, the signal processor includes a signal sampling circuit configured to produce a continuous-valued discrete-time sequence of the most recent N input samples, with the sequence being stored in a circular buffer arrangement of sample-and-hold circuits. Further, in its preferred embodiment, the signal processor includes a filter coefficient shift-register that stores digital filter coefficients, with the shift register contents being cyclically shifted to maintain the correct time correspondence with the input samples held in the circular buffer of input samples. Further, in its preferred embodiment, connections from the digital filter coefficient shift-register are made to a set of analog-digital multipliers such that polyphase filter coefficients can be extracted from the shift register. The analog-digital multipliers can be of a type that operate as digitally programmable amplifiers, or equivalently, that operate as multiplying digital-to-analog converters. For implementing interpolation by a factor of L (or decimation by a factor of M) the output rate is L times (or 1/M times) the input rate sample, there are L (or M) polyphase filters, the number of polyphase filter outputs that are summed is set to one (or M), and the number of multipliers is equal to N (or N/M). As well, for decimation, an input-phase-selection circuit is employed to provide M polyphase subsequences from the circular buffer of input samples.

Many other features, advantages and additional objects of the present invention will become manifest to those versed in the art upon making reference to the detailed description which follows and the accompanying sheets of drawings in which preferred embodiments incorporating the principles of this invention are disclosed as illustrative examples only.

DETAILED DESCRIPTION OF THE PREFERRED EMBODIMENT

Figure 1:
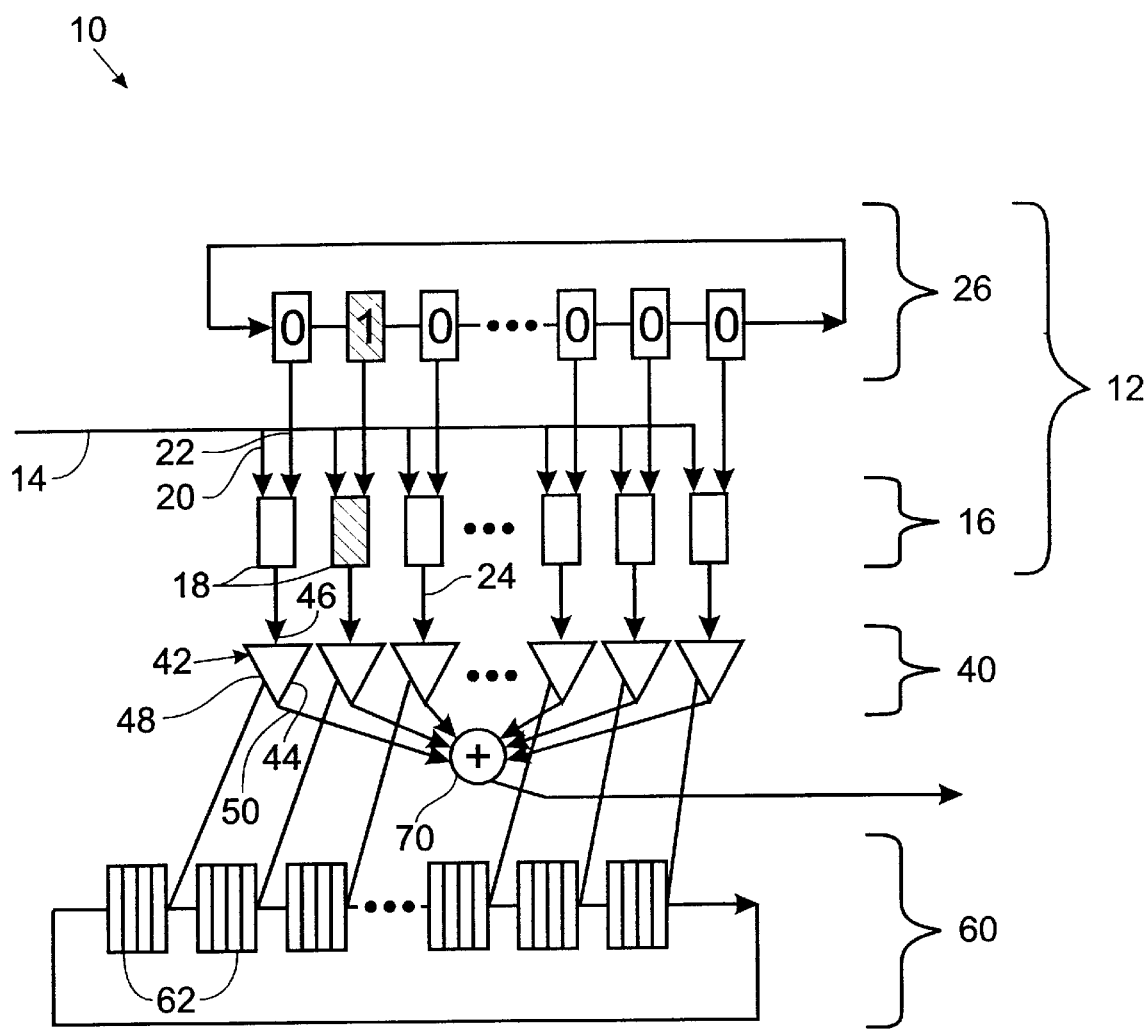
FIG. 1 shows a signal processor in the form of an interpolator constructed according to the present invention.
Figure 2:
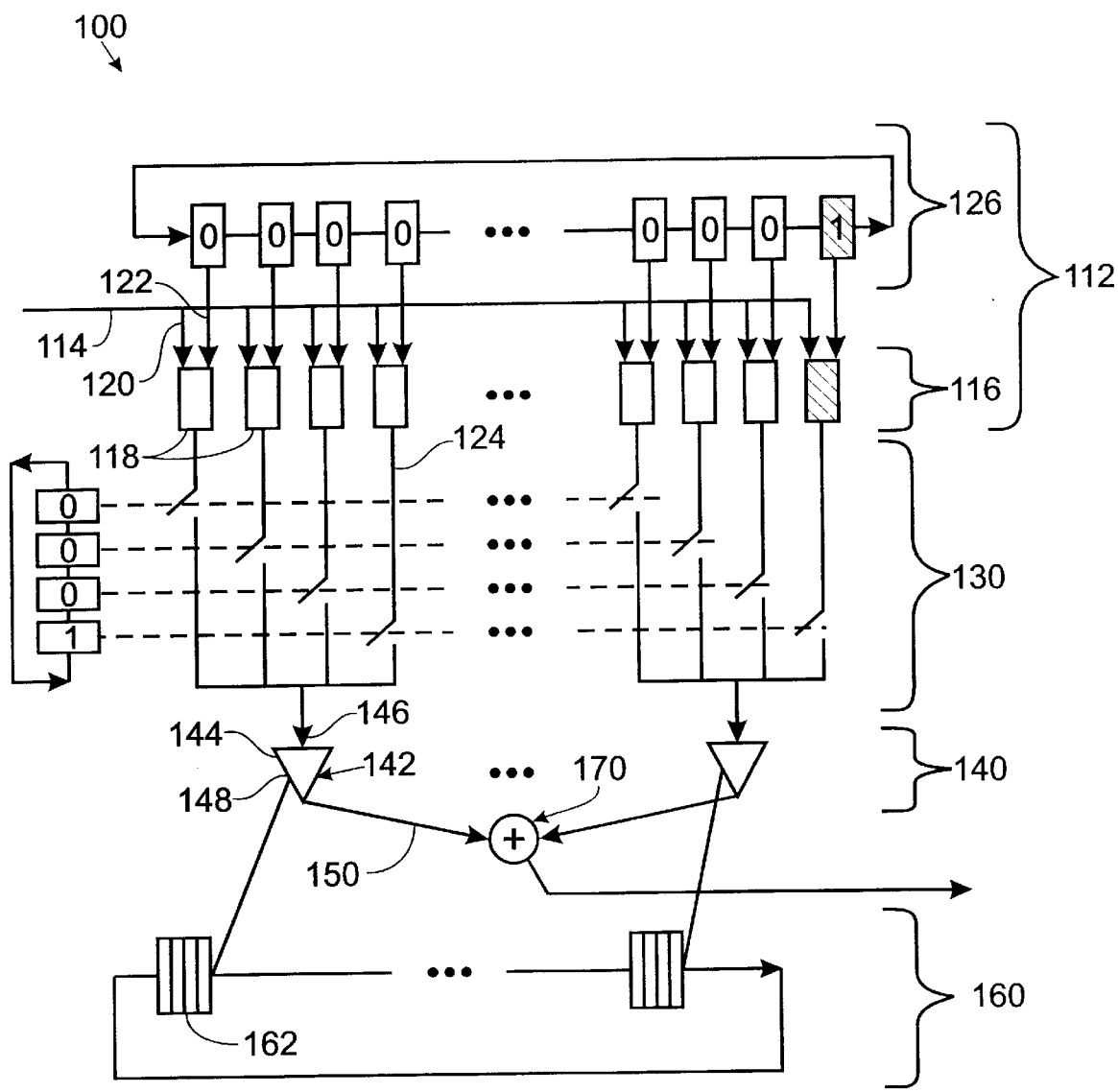
FIG. 2 shows a signal processor in the form of a decimator constructed according to the present invention.

In accordance with the present invention, signal processors are shown in FIG. 1 (interpolator 10) and FIG. 2 (decimator 100), each embodiment including a signal sampling circuit for sampling an analog input signal, a filter coefficient array to store plural filter coefficients, and plural multipliers configured to multiply the analog input signal samples by the filter coefficients.

In FIG. 1, the invention takes the form of a polyphase interpolator, shown generally at 10. Interpolator 10 includes a signal sampling circuit 12 connected to an analog input signal 14. As indicated, signal sampling circuit 12 includes a bank of N sample-and-hold circuits 18. Each sample-and-hold circuit has a signal input 20, a control input 22 and a signal output 24. All of the signal inputs are connected in parallel to analog input signal 14.

A sampling control circuit 26 is connected to the control input of each sample-and-hold circuit to trigger the operation thereof. The control circuit cyclically activates each of the sample-and-hold circuits at a sampling rate which will be determined by the particular application. With this cyclic activation of the sample-and-holds, the sample-and-hold circuits thus store a sample set of analog data values consisting of the sequence of the N most recent values of the input signal sampled at the sampling rate. It should be noted that the location of the most recent sample will cycle through the bank as each sample-and-hold circuit is activated. The sample window of the N most recent samples is stored with the most recent sample in the most recently activated sample-and-hold circuit, and the next most recent sample is stored in the next most recently activated sample-and-hold circuit, and so on, so that Nth most recent sample is stored in the Nth most recently activated sample-and-hold circuit.

This preferred sampling arrangement, which is described, for example, in U.S. Pat. Nos. 5,396,446 and 5,563,819, eliminates the cumulative errors that would occur if input samples were transferred from one sample-and-hold circuit to the next in an analog shift register arrangement.

The bank of sample-and-holds is operatively connected to a multiplying circuit 40 including plural digital-analog multipliers 42. In the preferred embodiment, each digital-analog multiplier 42 includes a programmable gain amplifier 44 with a signal input 46, a gain control input 48 and an intermediate output 50. The signal input of each amplifier is fed by a signal output from a respective sample-and-hold circuit. An example of a suitable multiplier for use in the present invention is shown in U.S. Pat. No. 5,381,352, which describes a circuit for multiplying an analog value by a digital value and is incorporated herein by reference. More generally, suitable devices are referred to as multiplying digital-to-analog converters. In the preferred embodiment, there are equal numbers of multipliers and sample-and-hold circuits with a one-to-one correspondence between sample-and-hold circuits and multipliers.

Interpolator 10 also includes a filter coefficient array in the form of a cyclic shift register 60. Shift register 60 includes plural cells 62 and is configured to store a set of filter coefficients corresponding, in the preferred embodiment, to the values of a lowpass FIR filter impulse response. The shift register cyclically shifts the filter coefficients stored in the cells. The filter impulse response is designed in accordance with well-known principles as described, for instance, in the text by Crochiere mentioned above. Although a lowpass filter is used in the preferred embodiment interpolator, it is possible to carry out other types of filtering (e.g., a correlation against a set of reference sample coefficients) with the described structure.

The number of filter coefficients in the shift register will be determined by up-sampling factor L (note that in FIG. 1, an interpolator with L=4 is shown). Accordingly, with N analog data values in the bank of sample-and-holds, there will be N times L cells and corresponding filter coefficients in the shift register.

As shown in FIG. 1, not every cell of the shift register is connected to the multipliers. More particularly, only every $L^{th}$ cell of the shift register is connected to one of the multipliers. Thus, only a polyphase subset of the filter coefficients is connected to the multipliers at any given time. Each time the filter coefficients are shifted in the shift register, the next polyphase subset of filter coefficients is connected to the multipliers. This arrangement gives L polyphase filters of length N to efficiently implement an overall filter of length N times L.

More specifically, it should be noted that the shift rate of the filter coefficients in the shift register is L times faster than the input sample rate. Thus, L polyphase filters are used to generate L outputs for every input sample period and therefore for each input sample set. A summer 70 is configured to add the intermediate outputs from each multiplier for each filter coefficient subset and generate the sum thereof and thereby form each polyphase filter output. The sequence of polyphase filter outputs is the interpolated, higher rate continuous-valued, discrete-time output.

Turning now to FIG. 2, a decimator is shown generally at 100, the decimator employing many of the same features as interpolator 10. Because of the close structural relation between the interpolator and decimator, the description of the decimator will follow the terminology previously described in the context of the interpolator.

Decimator 100 includes a signal sampling circuit 112 configured to operate as described above for signal sampling circuit 12. More particularly, sampling circuit 112 receives a continuous time analog input signal 114 and includes a bank of N sample-and-hold circuits 118. Each sample-and-hold circuit has a signal input 120, a control input 122 and a signal output 124. The sample-and-hold circuits are connected in parallel to analog input signal 114.

A sampling control circuit 126 is connected to the sample-and-hold circuits to control the operation thereof to periodically sample the analog input signal at a predetermined sampling rate. As with control circuit 26, control circuit 126 cyclically activates the sample-and-hold circuits, as described above.

The input samples stored on signal outputs of the bank of sample-and-holds are fed into an input-phase-selection circuit 130. Input-phase-selection circuit 130 is configured to selectively feed the signal output from every $M^{th}$ sample-and-hold to thereby partition the input sample set into M different sample polyphase subsets, where M equals the down-sampling factor (note that M=4 in the decimator illustrated in FIG. 2). The input-phase-selection circuit selects sequential sample polyphase subsets at the input sample rate.

The input sample subsets from the input-phase-selection circuit are input to a multiplying circuit 140 with N/M parallel multipliers 142. As before, each multiplier includes a programmable gain amplifier 144 with a signal input 146, a programmable gain control input 148 and an intermediate output 150.

Decimator 100 also includes a filter coefficient array in the form of a cyclic shift register 160 with plural cells 162 to store a set of filter coefficients, as described above for the interpolator. As with the interpolator, the filter is designed in accordance with well-known principles as described above.

The shift register is connected to the multiplying circuit in the same way as set forth above for the interpolator. More particularly, every M$^{th}$ cell of the shift register is connected to the gain control input of an amplifier to provide filter coefficients for polyphase filters in the form of M different filter coefficient subsets. By cycling the shift register, these polyphase filters are sequentially connected to the multiplying circuit. In contrast to the interpolator, in which the shift register is cycled at a rate L times greater than the input sampling rate, the shift register of the decimator is cycled at the input sampling rate. Each of the M sample subsets is multiplied by one of the M polyphase filters to generate an intermediate output. A summer 170 is connected to receive the intermediate outputs from the multiplying circuit and compute the sum thereof. Summer 170 accumulates M outputs from the M polyphase filters to generate one decimator output, so that the output rate is 1/M of the input sample rate. This arrangement gives M polyphase filters of length N/M to efficiently implement an overall filter of length N.

The described interpolator and decimator can be applied sequentially to provide an L/M sampling rate conversion if a non-integer conversion factor is desired.

Accordingly, while the present invention has been shown and described with reference to the foregoing preferred embodiment, it will be apparent to those skilled in the art that other changes in form and detail may be made therein without departing from the spirit and scope of the invention as defined in the appended claims.

The invention claimed is:

1. A signal processor for processing an analog input signal, the processor comprising:
   a signal sampling circuit configured to produce a sample set of analog data values corresponding to the amplitude of the analog input signal at various times;
   a filter coefficient array including plural filter coefficients, the plural filter coefficients being divided into at least two different filter coefficient subsets, each subset having a predetermined number N of filter coefficients, wherein said predetermined number N is selected based upon a desired output rate;
   a total of N multipliers operatively connected to the signal sampling circuit and the filter coefficient array and configured to:
   1) mulitply N analog data values from the sample set by respective N values from a selected one of the filter coefficient subsets to generate a first set of N intermediate values; and
   2) multiply N analog data values from the sample set by respective filter coefficients from a different selected one of the filter coefficient subsets to generate a second set of N intermediate values; and
   a summer circuit configured to sum the intermediate values for each selected filter coefficient subset, thereby providing output at said desired rate.

2. The signal processor of claim 1, wherein the signal sampling circuit includes a bank of sample-and-hold devices, the bank being configured to store analog data values corresponding to the values of the analog input signal at intervals in a sample window of time.

3. The signal processor of claim 1, wherein the signal processor has a sample interval and a sample window of time and the sample set of analog data values corresponds to the value of the input signal within the sample window at intervals separated by the sample interval, and wherein the signal sampling circuit includes a bank of sample-and-hold devices, the bank being configured to store analog data values, each corresponding to the value of the analog input signal at intervals of the sample interval in the sample window and wherein each sample-and-hold device in the bank includes a control input causes the device to take and hold a new sample when activated, and the signal sampling circuit includes a sampling control circuit configured to activate each of the control inputs in a cyclic fashioning at time intervals separated by the sample interval.

4. The signal processor of claim 1, wherein the filter coefficient array includes a shift register configured to store the plural filter coefficients.

5. The signal processor of claim 4, wherein each multiplier includes a programmable gain amplifier, each of the amplifiers having an input, an intermediate data value output and a gain control, with the input being connected to the signal sampling circuit to receive one of the analog data values and the gain control being connected to the filter coefficient array to receive one of the filter coefficients, wherein the summer circuit includes plural inputs connected to the intermediate data value outputs of the plural amplifiers.

6. The signal processor of claim 1, wherein the number of filter coefficients is a non-unitary integer multiple of the number of data values in the sample set of analog data values.

7. The signal processor of claim 6, wherein the number of data values in the sample set is equal to the total number of multipliers.

8. The signal processor of claim 7, wherein each multiplier is configured to multiply one of the analog data values in the sample set by a corresponding data value in the selected filter coefficient subset so that the multipliers thereby multiply each analog data value in the sample set by a corresponding data value in the selected filter coefficient subset.

9. The signal processor of claim 1, wherein the set of filter coefficients consists of a FIR lowpass filter impulse response.

10. The signal processor of claim 1, wherein each of the filter coefficient subsets are polyphase filters from a FIR filter impulse response.

11. The signal processor of claim 1, wherein the total number of filter coefficients is equal to the number of data values in the sample set of analog data values, the number of data values in the sample set of analog data values being a non-unitary integer multiple of the number of multipliers.

12. The signal processor of claim 11, wherein the sample set is divided into plural subsets, with each subset containing a number of analog data values equal to the number of multipliers, each multiplier being configured to multiply one of the analog data values in a selected sample set subset by a corresponding filter coefficient in the selected filter coefficient subset so that the multiplier circuit thereby multiplies each analog data value in the sample set subset by a corresponding data value in the selected filter coefficient subset.

13. The signal processor of claim 12, wherein the summer circuit is configured to accumulate the sums of the intermediate data values for every filter coefficient subset to generate the output value.

14. The signal processor of claim 12, further including an input-phase-selection circuit connecting the signal sampling circuit to the multipliers, the input-phase-selection circuit being configured to provide the analog data values from any selected sample set subset to the multipliers.

15. The signal processor of claim 14, wherein the input-phase-selection circuit is configured to provide the analog data values from each sample set subset to the multipliers in a cyclic fashion.

16. A signal processor in the form of a polyphase interpolator for processing an analog input signal, the interpolator comprising:

a bank of N sample-and-hold devices, the bank including sampling control circuitry configured to sequentially activate each of the sample-and-hold devices at a predetermined sampling rate to sample the input signal and store a sample set of analog input samples corresponding to the values of the input signal for the last N samples taken at the sampling rate;

a register of Q cells configured to store a set of Q filter coefficients corresponding to the values of a lowpass filter impulse response, Q being equal to the product of N and L, with L being an integer upsampling factor for the interpolator;

N multipliers, each multiplier being configured to provide for multiplication of an analog data value stored in one of the sample-and-hold devices by a filter coefficient stored in a corresponding one of the cells to produce an intermediate value, the multipliers being configured to multiply the input sample set by a filter coefficient subset including the coefficients in every $L^{th}$ cell of the register; and a summer connected to each of the multipliers to sum the intermediate values to generate interpolated output values at an output rate, where the output rate is equal to L times the sampling rate.

17. The interpolator of claim 16, wherein the register is a cyclic shift register configured to shift and cycle the Q filter coefficients at the output rate and where the multipliers are connected to every $L^{th}$ cell of the register.

18. The interpolator of claim 16, wherein the control circuitry is configured to cyclically activate sample-and-hold devices.

19. A signal processor in the form of a polyphase decimator for processing an analog input signal, the decimator comprising:

a bank of N sample-and-hold devices, the bank including sampling control circuitry configured to sequentially activate each of the sample-and-hold devices at a predetermined sampling rate to sample the input signal and store a sample set of analog input samples corresponding to the values of the input signal for the last N samples taken at the sampling rate;

an input-phase-selection circuit configured to selectively feed the input samples from every $M^{th}$ sample-and-hold device to sequentially create M different input sample subsets, M being an integer downsampling factor for the decimator;

a register of N cells configured to store a set of N filter coefficients corresponding to the values of a lowpass filter impulse response;

R multipliers, R being equal to N divided by M, each multiplier being configured to provide for multiplication of an analog input sample stored in one of the sample-and-hold devices in one of the M input sample subsets by a coefficient stored in a corresponding one of the cells to produce an intermediate value, the multipliers being configured collectively to multiply an input sample subset by a subset of filter coefficients including the coefficients in every $M^{th}$ cell of the register; and a summer connected to each of the multipliers to sum the intermediate values from each of the multipliers for each of the M sample subsets to generate an output value every $M^{th}$ sampling interval.

20. The decimator of claim 19, wherein the register is a cyclic shift register configured to shift and cycle the N filter coefficients at the sampling rate and where the multipliers are connected to every $M^{th}$ cell of the register.

21. The decimator of claim 19, wherein the control circuitry is configured to cyclically activate sample-and-hold devices.

* * * * *